(12) United States Patent
Tsai et al.

(10) Patent No.: US 9,897,845 B2
(45) Date of Patent: Feb. 20, 2018

(54) DISPLAY

(71) Applicant: InnoLux Corporation, Jhu Nan, Miao Li County (TW)

(72) Inventors: Chia-Hao Tsai, Jhu-Nan (TW); Chih-Lung Lin, Jhu-Nan (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 15/219,855

(22) Filed: Jul. 26, 2016

(65) Prior Publication Data

US 2016/0334667 A1 Nov. 17, 2016

Related U.S. Application Data

(63) Continuation of application No. 13/939,508, filed on Jul. 11, 2013, now Pat. No. 9,423,644.

(30) Foreign Application Priority Data

Jul. 13, 2012 (TW) .............................. 101125239 A

(51) Int. Cl.
*G02F 1/136* (2006.01)
*G02F 1/1335* (2006.01)
(Continued)

(52) U.S. Cl.
CPC ...... *G02F 1/133512* (2013.01); *G02F 1/1368* (2013.01); *G02F 1/133345* (2013.01); *G02F 1/133514* (2013.01); *G02F 1/134309* (2013.01); *G02F 1/136209* (2013.01); *G02F 1/136286* (2013.01); *H01L 27/124* (2013.01); *H01L 27/1225* (2013.01); *H01L 29/7869* (2013.01); *H01L 29/78633* (2013.01); *H01L 29/78696* (2013.01); *G02F 2201/121* (2013.01);
(Continued)

(58) Field of Classification Search
None
See application file for complete search history.

(56) References Cited

U.S. PATENT DOCUMENTS 6,476,418 B1 * 11/2002 Shiga ................ H01L 29/78696
257/59
7,956,947 B2  6/2011 Lee et al.
(Continued)

FOREIGN PATENT DOCUMENTS

CN        1490652 A      4/2004
CN      102253544 A     11/2011
(Continued)

OTHER PUBLICATIONS

Chinese Office Action dated Jul. 28, 2015, as issued in China Patent Application No. 201210243981.3 (8 pages).

*Primary Examiner* — Richard Kim
(74) *Attorney, Agent, or Firm* — Muncy, Geissler, Olds & Lowe, P.C.

(57) ABSTRACT

A display is provided which includes: a first substrate; gate lines and data lines; transistors respectively located in pixel areas, wherein each of the transistors includes: an active layer on the first substrate and having a first end portion, a second end portion, and a necked-down portion connecting the first and the second end portions; a second substrate on the first substrate; and a display medium between the first substrate and the second substrate.

7 Claims, 11 Drawing Sheets

(51) Int. Cl.
    *G02F 1/1362*    (2006.01)
    *G02F 1/1368*    (2006.01)
    *H01L 29/786*    (2006.01)
    *G02F 1/1333*    (2006.01)
    *G02F 1/1343*    (2006.01)
    *H01L 27/12*     (2006.01)

(52) U.S. Cl.
    CPC .... *G02F 2201/123* (2013.01); *G02F 2201/40* (2013.01); *G02F 2203/04* (2013.01)

(56) References Cited

U.S. PATENT DOCUMENTS

| | | |
|---|---|---|
| 2001/0046017 A1 | 11/2001 | Niwano et al. |
| 2002/0085149 A1 | 7/2002 | Kim et al. |
| 2005/0007512 A1 | 1/2005 | Matsunaga et al. |
| 2005/0099551 A1 | 5/2005 | Yang et al. |
| 2008/0043196 A1* | 2/2008 | Fujita .................... G02F 1/1345 349/152 |
| 2012/0126236 A1 | 5/2012 | Juhmonji |

FOREIGN PATENT DOCUMENTS

| | | |
|---|---|---|
| CN | 102437194 A | 5/2012 |
| JP | H08330595 A | 12/1996 |
| TW | 580732 B | 3/2004 |

\* cited by examiner

DISPLAY

CROSS REFERENCE TO RELATED APPLICATIONS

This application is a continuation of U.S. patent application Ser. No. 13/939,508, filed on Jul. 11, 2013, which claims priority of Taiwan Patent Application No. 101125239, filed on Jul. 13, 2012, the entirety of which is incorporated by reference herein.

BACKGROUND OF THE INVENTION

Field of the Invention

The present invention relates to a display, and in particular relates to a display with a black matrix.

Description of the Related Art

Liquid crystal displays have many advantages, such as lightness, thinness, and low power consumption, so liquid crystal displays have become the mainstream displays. The liquid crystal display includes a liquid crystal display panel. The liquid crystal display panel includes a thin film transistor substrate, a color filter substrate, and a liquid crystal layer sandwiched therebetween.

The color filter substrate has a substrate and a color filter layer formed thereon, and the color filter layer is composed of a plurality of red, green, blue pixels and a black matrix separating the pixels from each other. The black matrix can prevent thin film transistors from being exposed to light (the thin film transistors exposed to light may produce a current leakage, which adversely affecting image quality), can prevent color mixture between adjacent pixels, and can improve contrast.

With the progress in manufacturing technologies of display, each unit pixel area has shrunk to improve image quality. However, as the unit pixel area shrinks the ratio of the black matrix to the unit pixel area increases, which substantially decreases the aperture ratio of the pixel.

BRIEF SUMMARY OF THE INVENTION

An embodiment of the invention provides a display which includes: a first substrate; a plurality of gate lines and data lines disposed on the first substrate and cross each other and cross each other; a display medium disposed on the first substrate; a plurality of transistors corresponding to the gate lines and the data lines respectively, wherein each of the transistors comprises: a gate electrode and a semiconductor layer overlapping with the gate electrode. The semiconductor layer has a first end portion, a second end portion and a necked-down portion disposed between the first end portion and the second end portion, and a first width of the necked-down portion along a direction perpendicular to an extension direction of one of the gate lines is less than a second width of the first end portion along the direction and a third width of the second end portion along the direction. In addition, a projection projected from an entirety of the semiconductor layer on the first substrate is located within a projection of the gate line electrode on the first substrate. In some embodiments, the semiconductor layer is in a substantially U-shape in a top view. Alternatively, the semiconductor layer is in a substantially H-shape in a top view.

Another embodiment of the invention provides a display which includes: a first substrate; a display medium disposed on the first substrate; and a transistor disposed on the first substrate and comprising: a gate electrode, and an semiconductor layer having a first end portion, a second end portion and a necked-down portion disposed between the first end portion and the second end portion, wherein at least a part of the first end portion overlaps with the gate electrode.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1A:
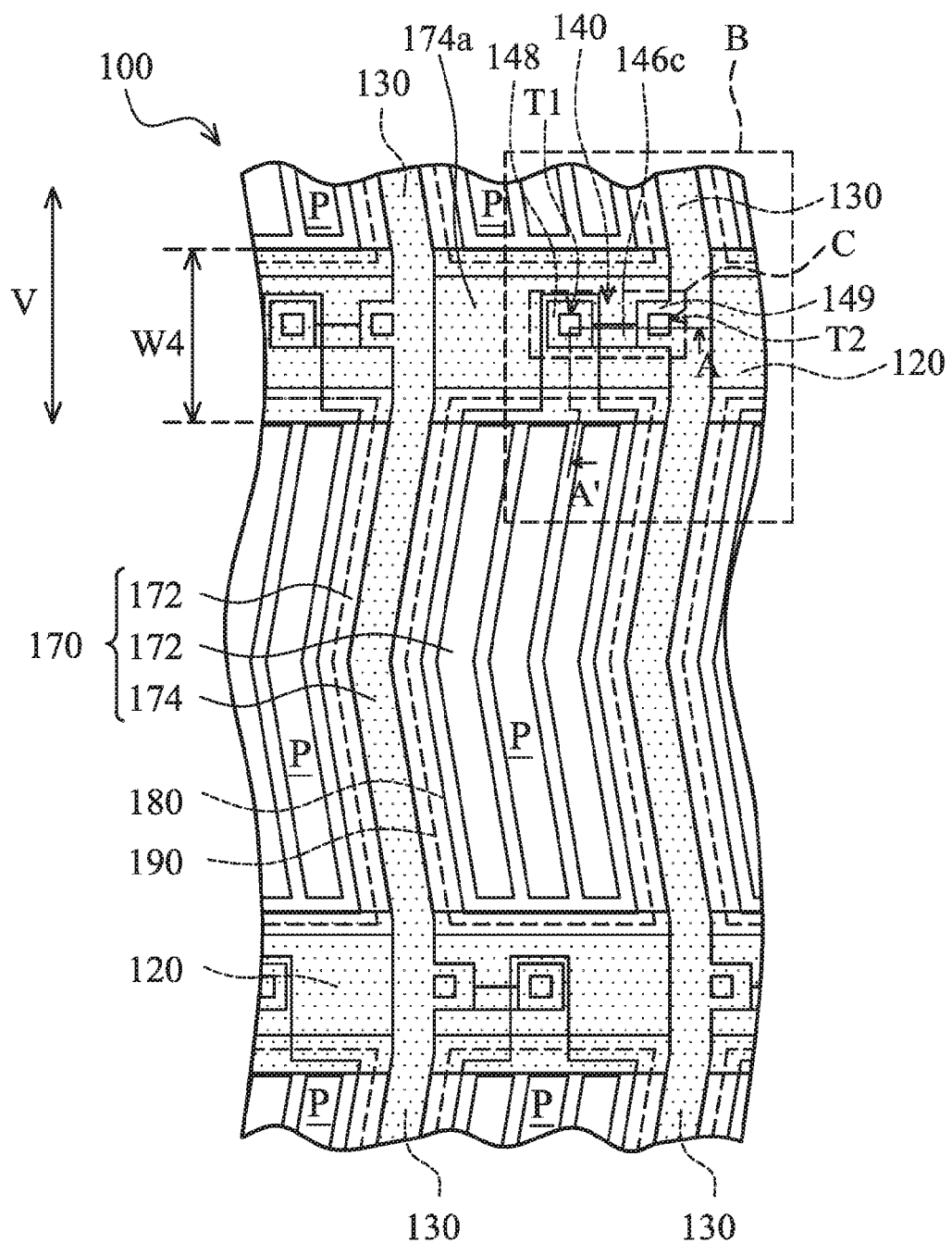
FIG. 1A is a top view of a display according to an embodiment of the present invention.
Figure 1B:
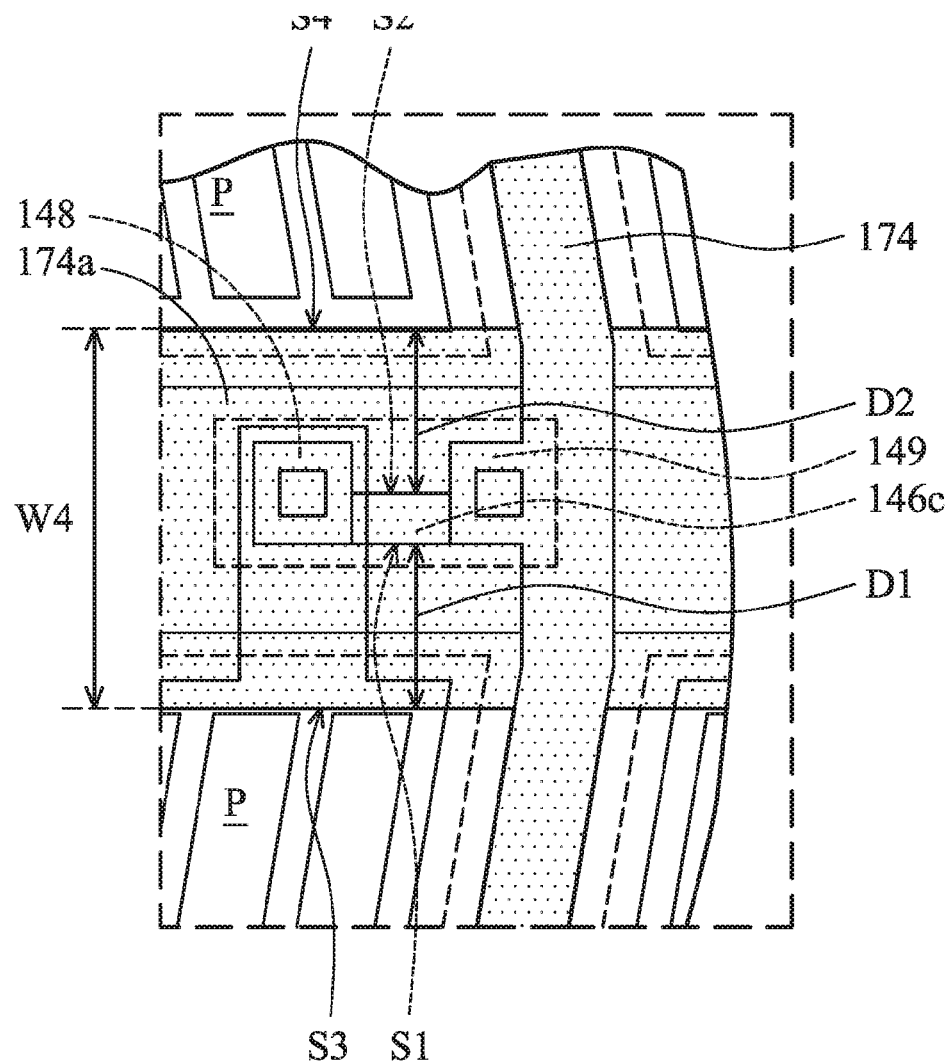
FIG. 1B is a top view of an active layer in the area B of FIG. 1A, and shows locations of two through holes of an etching protective layer on the active layer.
Figure 1C:
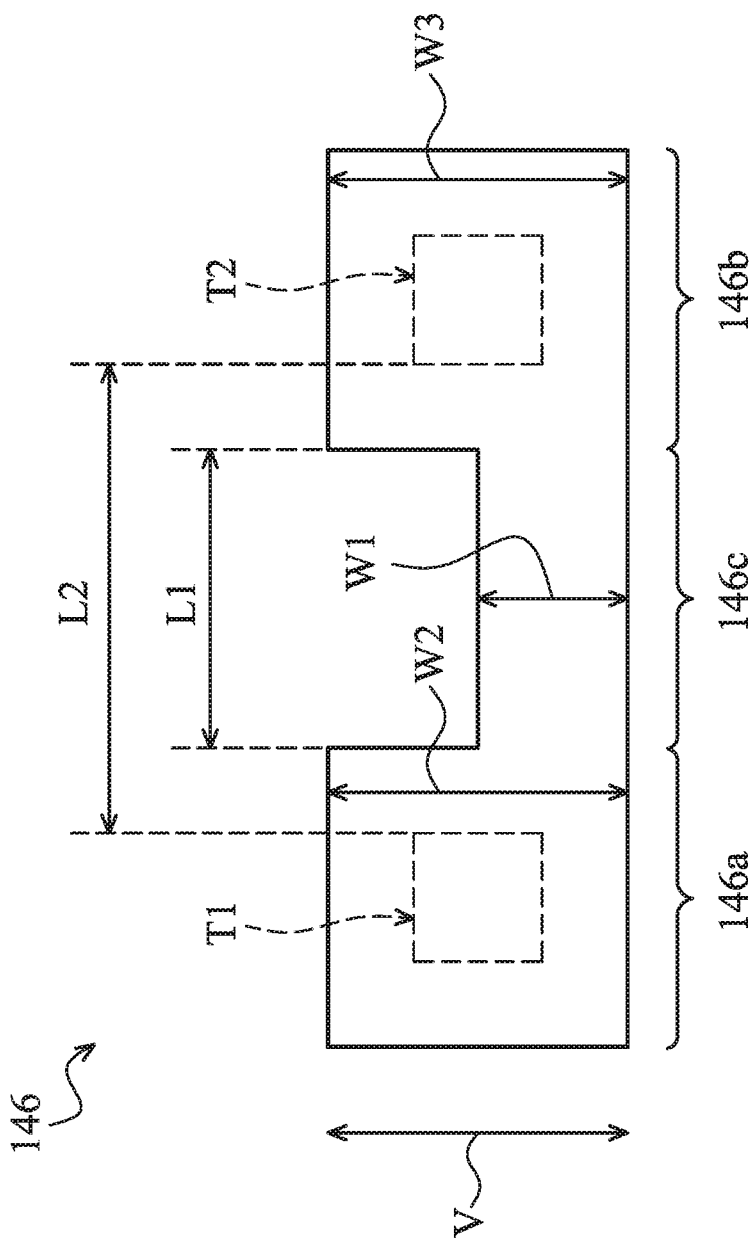
FIG. 1C is a top view of the active layer in the area C of FIG. 1A, and shows locations of two through holes of the etching protective layer on the active layer.
Figure 1D:
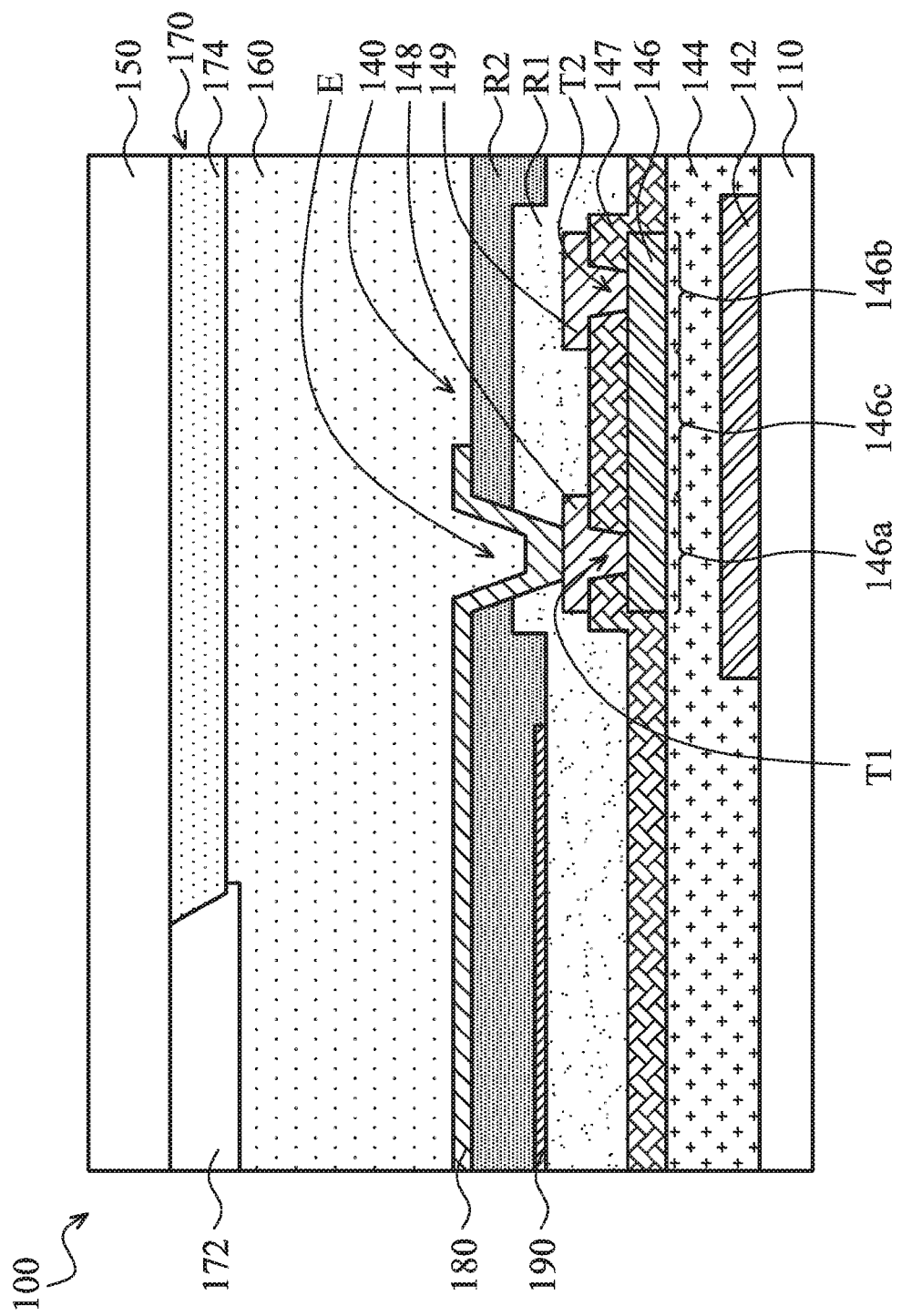
FIG. 1D is a cross-sectional view of the display along a sectional line A-A' in FIG. 1A.

FIG. 1A is a top view of a display according to an embodiment of the present invention. FIG. 1B is a top view of an active layer in the area B of FIG. 1A, and shows locations of two through holes of an etching protective layer on the active layer. FIG. 1C is a top view of the active layer in the area C of FIG. 1A, and shows locations of two through holes of the etching protective layer on the active layer. FIG. 1D is a cross-sectional view of the display along a sectional line A-A' in FIG. 1A. It should be noted that, for the sake of simplicity, FIG. 1A omits a first substrate, a second substrate, a display medium and an insulating layer.

Referring to FIGS. 1A and 1D, a display 100 of the present embodiment includes a first substrate 110, a plurality of gate lines 120, a plurality of data lines 130, a plurality of transistors 140, a second substrate 150 and a display medium 160, wherein the second substrate 150 is disposed on the first substrate 110, and the display medium 160 is disposed between the first substrate 110 and the second substrate 150.

Specifically, the gate lines 120 and the data lines 130 are disposed on the first substrate 110 and cross each other to define a plurality of pixel areas P. The pixel areas P may include red pixel areas, green pixel areas and blue pixel areas. The transistors 140 are located in the pixel areas P respectively, and are electrically connected to the corresponding gate lines 120 and the corresponding data lines 130 respectively. As shown in FIG. 1D, each of the transistors 140 includes a gate electrode 142, a gate insulating layer 144, an active layer 146, an etching protective layer 147, a drain electrode 148, and a source electrode 149.

Specifically, the gate electrode 142 is disposed on the first substrate 110, and the gate insulating layer 144 covers the gate electrode 142, wherein the gate electrode 142 is a portion of the gate line 120. The active layer 146 is disposed on the gate insulating layer 144 and above the gate electrode 142. The active layer 146 includes, for example, Indium-Gallium-Zinc oxides (IGZO) or other suitable semiconductor oxides.

Referring to FIG. 1C, the active layer 146 has a first end portion 146a, a second end portion 146b, and a necked-down portion 146c connecting between the first end portion 146a and the second end portion 146b. As shown in FIG. 1A, a first width W1 of the necked-down portion 146c in an axial direction V perpendicular to the gate lines 120 is less than a second width W2 of the first end portion 146a in the axial direction V and a third width W3 of the second end portion 146b in the axial direction V.

In one embodiment, the first width W1 ranges from about 3 μm to about 6 μm, and the second width W2 and the third width W3 range from about 7 μm to about 15 μm respectively. The difference between the second width W2 and the first width W1 ranges from about 1 μm to about 12 μm. It should be appreciated that the first width W1, the second width W2, the third width W3 and the difference therebetween may be changed with the reduction of the unit pixel area, but the ratio of the first width W1 to the second width W2 or the third width W3 may be controlled ranging from, for example, about 0.2 to about 0.86. The length L1 of the necked-down portion 146c in the extending direction of the gate lines 120 is about 2 μm to about 7 μm. The through hole spacing L2 ranges from about 4 μm to 13 μm. The channel width/length ratio of the transistor 140 (i.e. the first width W1/the through hole spacing L2) ranges from, for example, about 0.3 to about 1. In one embodiment, the active layer 146 of the transistor 140 is substantially in an U-shape in the top view.

Referring to FIGS. 1A, 1C and 1D, the etching protective layer 147 covers the active layer 146 and has two through holes T1 and T2 respectively exposing the first end portion 146a and the second end portion 146b of the active layer 146. The etching protective layer 147 may include oxides (e.g. silicon oxide) or other suitable insulating materials.

Referring to FIGS. 1A and 1D, the drain electrode 148 and the source electrode 149 are disposed on the etching protective layer 147 and are electrically connected to the active layer 146 through the through holes T1 and T2 respectively. The source electrode 149 is connected to the data line 130. The drain electrode 148 and the source electrode 149 shield the first end portion 146a and the second end portion 146b respectively, and do not shield the necked-down portion 146c.

Furthermore, the display 100 may optionally include a color filter array 170. The color filter array 170 is disposed between the first substrate 110 and the second substrate 150. The color filter array 170 includes a plurality of color filter films 172 respectively corresponding to a plurality of pixel areas P, and a black matrix 174 corresponding to the gate lines 120 and the data lines 130, wherein the black matrix 174 shields the necked-down portion 146c of each of the transistors 140. The color filter films 172 may include red color filter films, green color filter films, and blue color filter films.

As shown in FIG. 1B, in the present embodiment, the shielding portion 174a of the black matrix 174 shielding the transistors 140 is substantially designed to shield the necked-down portions 146c as completely as possible. Thus, the black matrix 174 is disposed above the necked-down portion 146c, and the black matrix 174 respectively extends in directions away from the opposite two sides S1 and S2 of the necked-down portion 146c in the axial direction V for a shielding extension distance to prevent the necked-down portion 146c from being irradiated by environmental light. Based on the above design principles, in the present embodiment, the width of the necked-down portion 146c is reduced (compared to the widths of the first end portion 146a and the second end portion 146b) to reduce the width of the black matrix 174.

Specifically, the black matrix 174 has a plurality of shielding portions 174a shielding the transistors 140, and each of the shielding portions 174a has two opposite sides S3 and S4 respectively corresponding to the two opposite sides S1 and S2 of the necked-down portion 146c. In one embodiment, the distance D1 between the side S3 and the side S1 is substantially equal to the distance D2 between the side S2 and the side S4. That is, the shielding extension distances (i.e. the distances D1 and D2) of the black matrix 174 corresponding to the two opposite sides S1 and S2 of the necked-down portion 146c are equal to each other. In one embodiment, the distances D1 and D2 range from, for example, about 1 μm to about 15 μm. The shielding portion 174a of the black matrix 174 shielding the transistors 140 has a fourth width W4 ranging from about 3 μm to about 36 μm in the axial direction V. In one embodiment, the fourth width W4 ranges from about 4 μm to about 20 μm in the axial direction V.

It should be noted that, in the present embodiment, the width of the portion of the active layer 146 easily irradiated by environmental light (i.e. the necked-down portion 146c, which is not shielded by the drain electrode 148 and the source electrode 149) is reduced to reduce the width of the black matrix 174 used to shield the active layer 146 (the reduced magnitude is equal to the difference between W1 and W2 and/or W3), which effectively increases the pixel aperture ratio.

In one embodiment, when the resolution of the pixels is 264 ppi (pixels per inch) and the first width W1 of the necked-down portion 146c is smaller than the second width W2 of the first end portion 146a and the third width W3 of the second end portion 146b by 5 µm, the aperture ratio of the display of the present embodiment may be increased by 4% compared to the conventional display with the active layer being not partially reduced.

Furthermore, the display 100 may optionally include a plurality of pixel electrodes 180, a plurality of common electrode 190, a first insulating layer R1, and a second insulating layer R2. Specifically, as shown in FIG. 1A, the pixel electrodes 180 are disposed in the pixel areas P respectively and are electrically connected to the corresponding transistors 140. The common electrodes 190 are below the corresponding pixel electrodes 180 respectively.

Specifically, as shown in FIG. 1D, the first insulating layer R1 may be formed on the etching protective layer 147, wherein the first insulating layer R1 may cover the drain electrode 148 and the source electrode 149, and then the common electrode 190 may be formed on the first insulating layer R1. Then, the second insulating layer R2 is formed on the first insulating layer R1 and covers the common electrode 190. Then, contact holes E passing through the first insulating layer R1 and the second insulating layer R2 are formed and the pixel electrodes 180 are formed on the second insulating layer R2. The pixel electrodes 180 may be electrically connected to the drain electrode 148 through the contact holes E.

In one embodiment, the display medium 160 may be a liquid crystal layer, and the display 100 may be a liquid crystal display. In another embodiment, the display medium 160 may be an organic light emitting layer, and the display 100 may be an organic light emitting diode display.

Figure 2A:
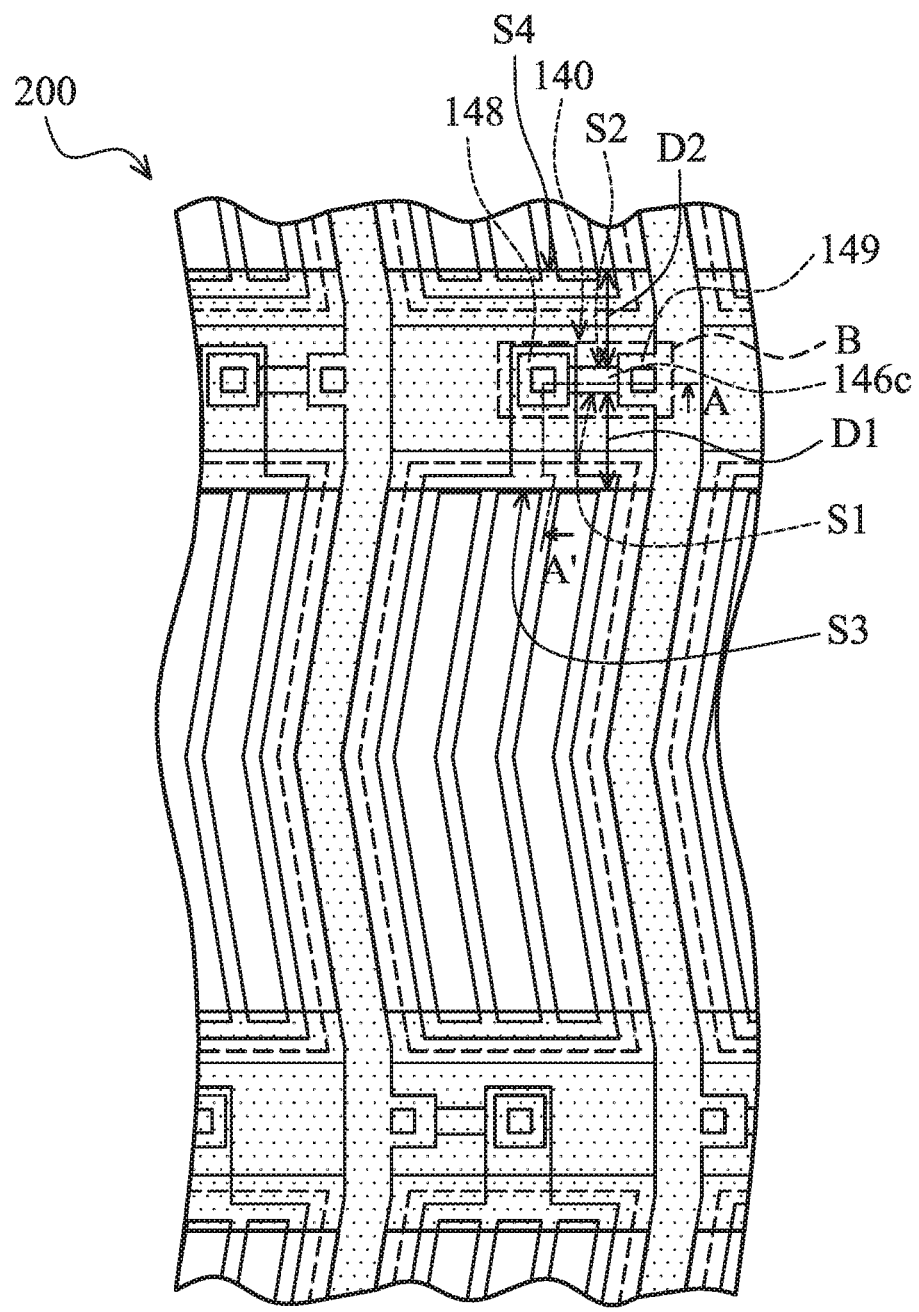
FIG. 2A is a top view of a display according to another embodiment of the present embodiment.
Figure 2B:
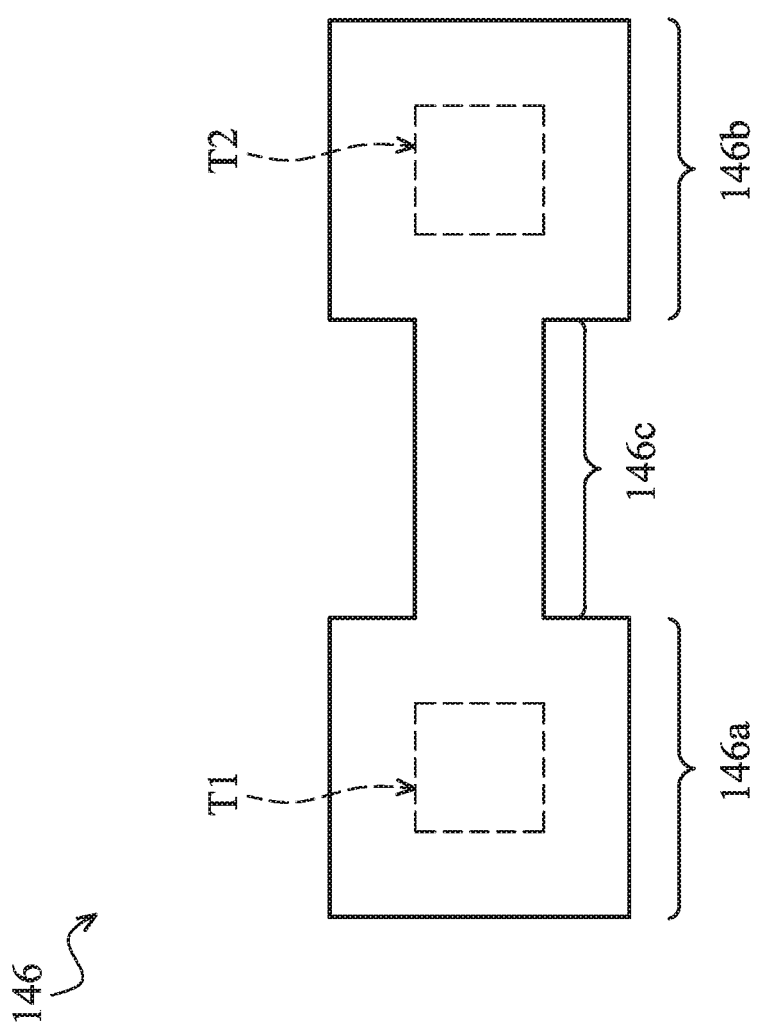
FIG. 2B is a top view of the active layer in a region C of FIG. 2A and marks the locations of the two through holes of the etching protective layer on the active layer.

FIG. 2A is a top view of a display according to another embodiment of the present embodiment. FIG. 2B is a top view of the active layer in a region C of FIG. 2A and marks the locations of the two through holes of the etching protective layer on the active layer. It should be noted that, for the sake of simplicity, FIG. 2A omits the first substrate, the second substrate, the display medium and the insulating layer. Referring to FIGS. 2A and 2B, the display 200 of the present embodiment is similar to the display 100 of FIG. 1A except that the active layers 146 of the transistors 140 of the present embodiment have a substantially H shape in the top view.

Figure 3A:
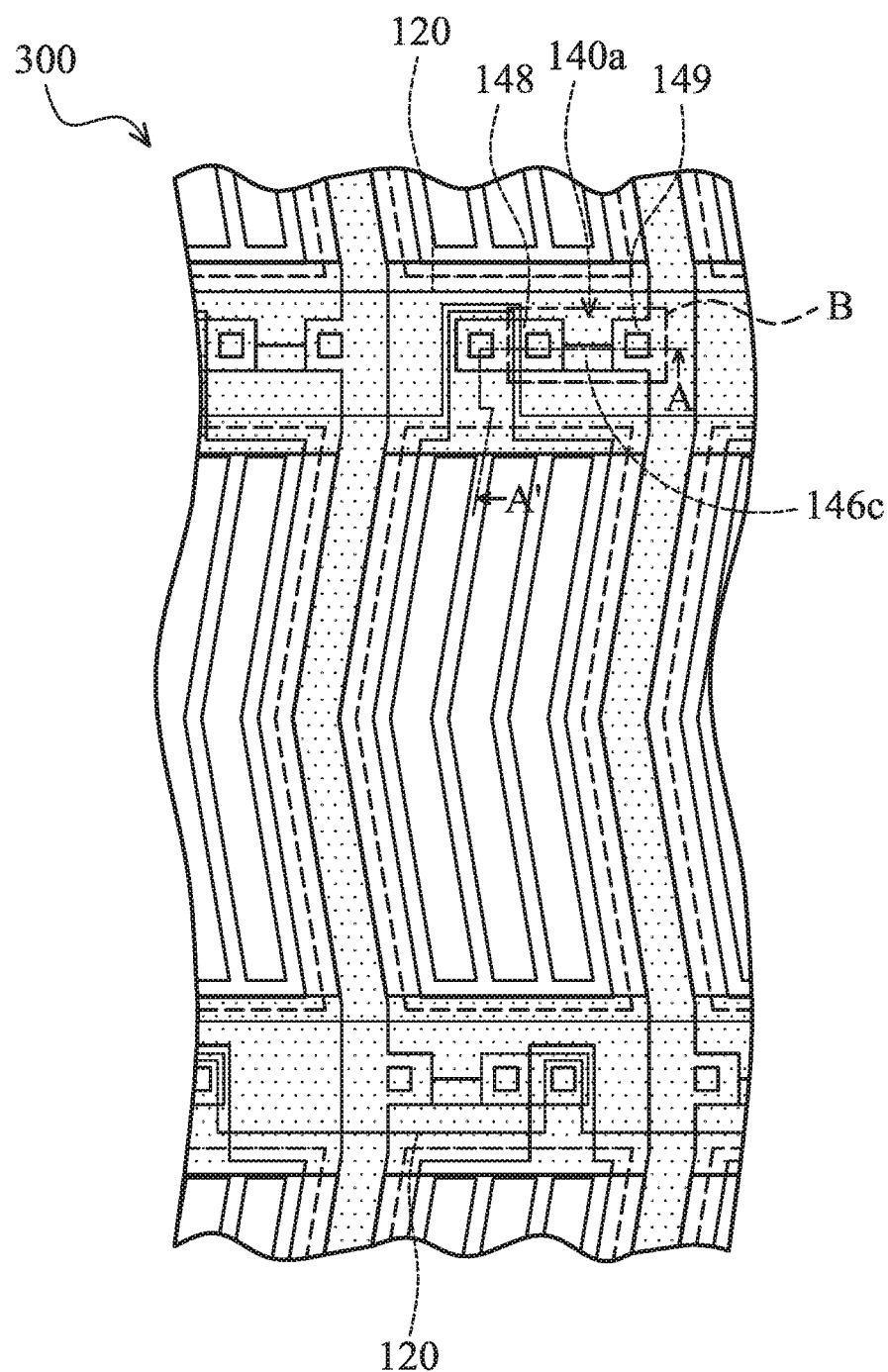
FIG. 3A is a top view of a display according to still another embodiment of the present embodiment.
Figure 3B:
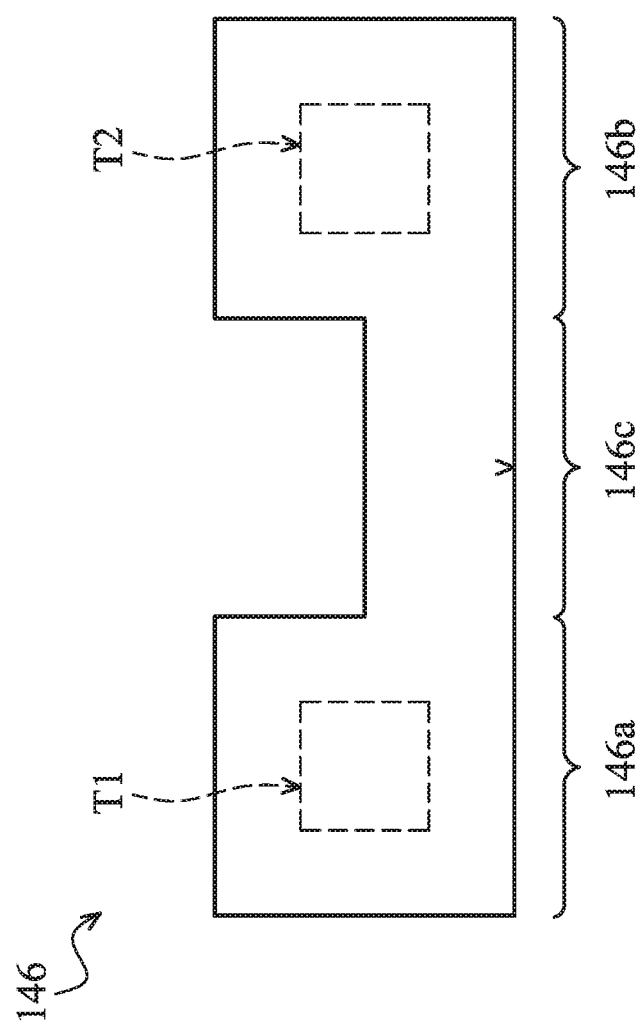
FIG. 3B is a top view of the active layer in a region C of FIG. 3A and marks the locations of the two through holes of the etching protective layer on the active layer.
Figure 3C:
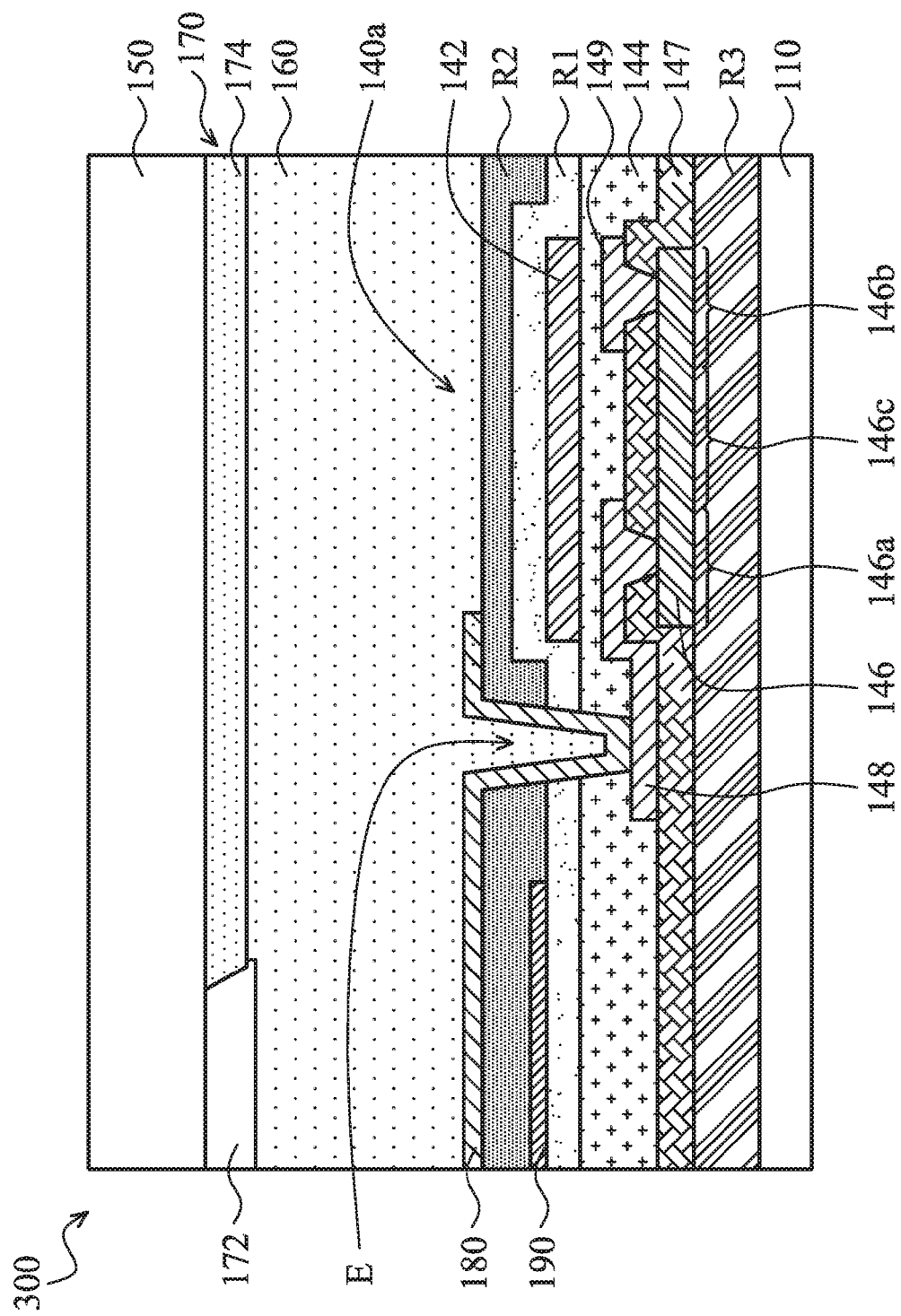
FIG. 3C is a cross-sectional view of the display along a sectional line A-A' in FIG. 3A.

FIG. 3A is a top view of a display according to still another embodiment of the present embodiment. FIG. 3B is a top view of the active layer in a region C of FIG. 3A and marks the locations of the two through holes of the etching protective layer on the active layer. FIG. 3C is a cross-sectional view of the display along a sectional line A-A' in FIG. 3A. It should be noted that, for the sake of simplicity, FIG. 3A omits the first substrate, the second substrate, the display medium and the insulating layer.

Referring to FIGS. 3A and 3C, the display 300 of the present embodiment is similar to the display 100 of FIG. 1A except that the transistors 140a of the display 300 of the present embodiment are top-gate transistors (the transistors 140 of the display 100 are bottom-gate transistors).

Specifically, the gate insulating layer 144 of the display 300 of the present embodiment is on the etching protective layer 147 and covers the drain electrode 148 and the source electrode 149, and the gate electrode 142 is disposed on the gate insulating layer 144 and above the active layer 146. The contact holes E of the present embodiment pass through the first and the second insulating layers R1 and R2 and the gate insulating layer 144, such that the pixel electrodes 180 may be electrically connected to the drain electrodes 148 through the contact holes E. The display 300 of the present embodiment may further include a buffer layer R3 formed on the substrate 110, and the active layer 146 is formed on the buffer layer R3. Referring to FIG. 3B, in one embodiment, the active layers 146 of the transistors 140a have a substantially U shape in the top view.

Figure 4A:
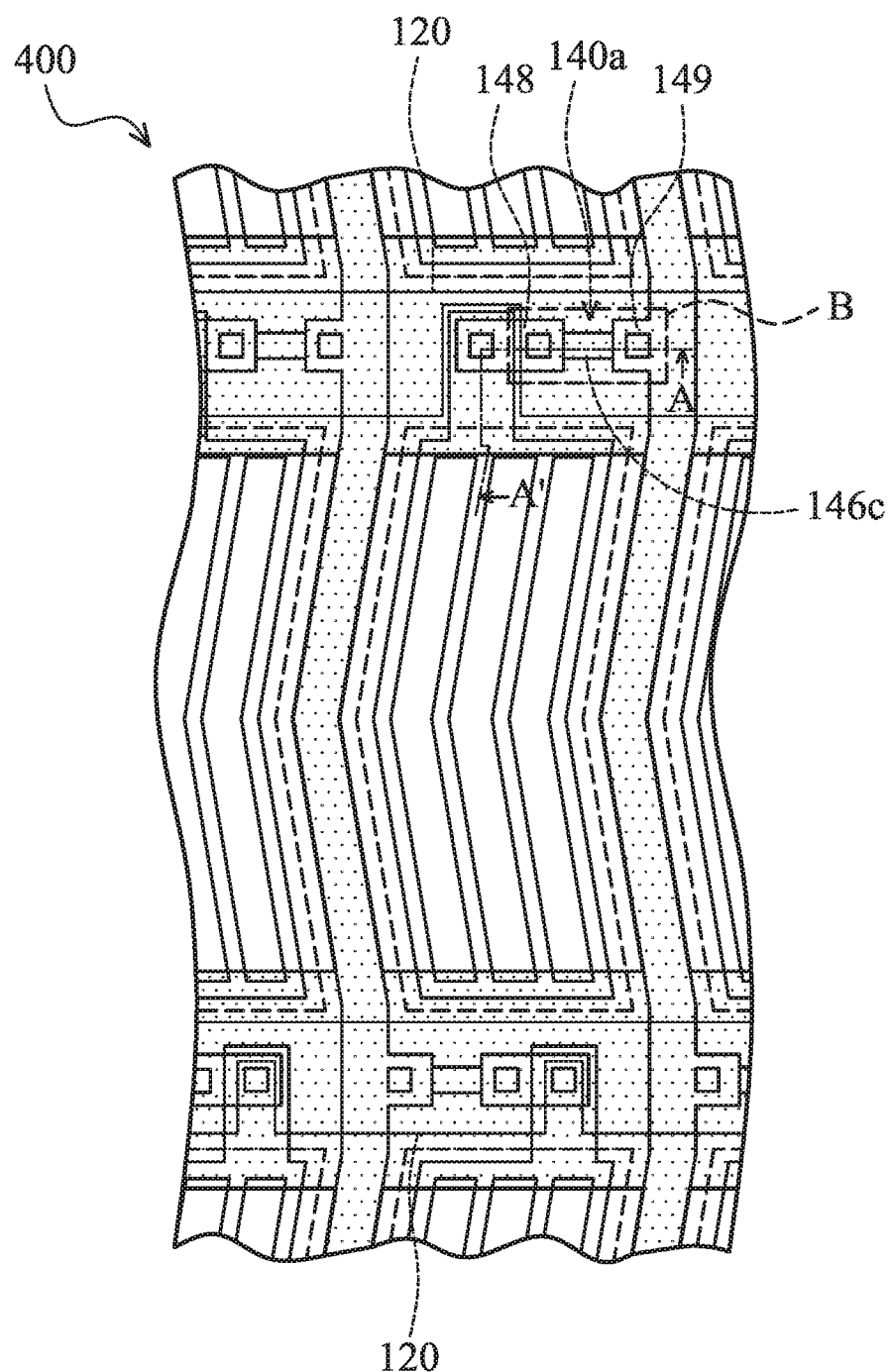
FIG. 4A is a top view of a display according to one embodiment of the present embodiment.
Figure 4B:
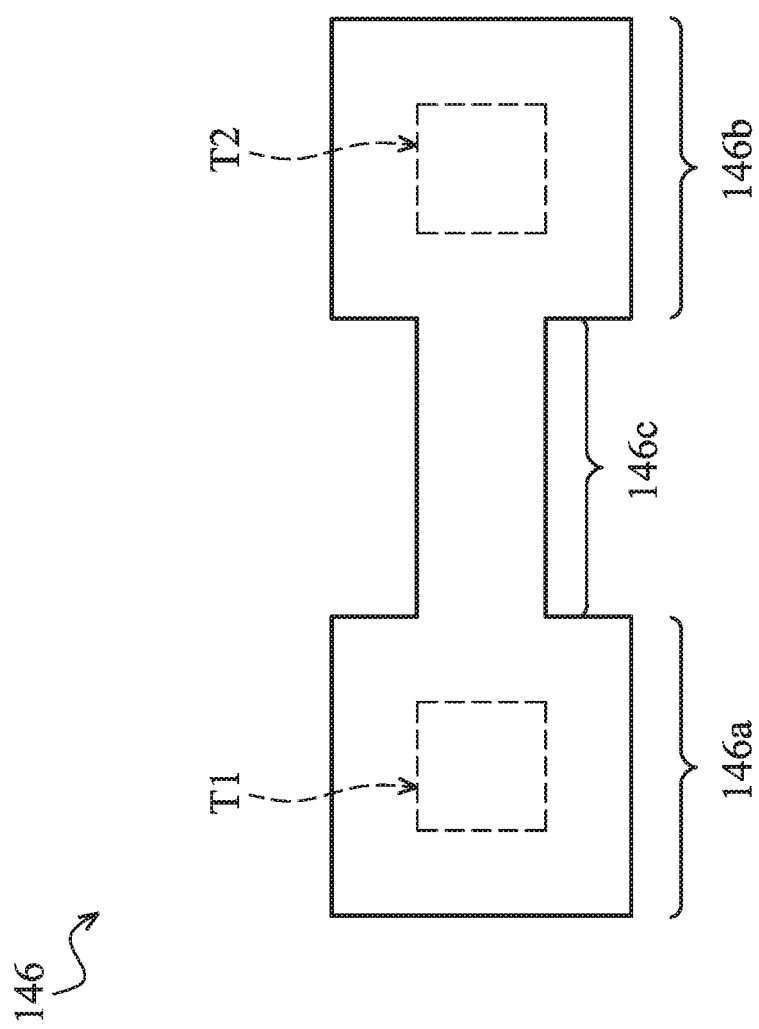
FIG. 4B is a top view of the active layer in a region C of FIG. 4A and marks the locations of the two through holes of the etching protective layer on the active layer.

FIG. 4A is a top view of a display according to one embodiment of the present embodiment. FIG. 4B is a top view of the active layer in a region C of FIG. 4A and marks the locations of the two through holes of the etching protective layer on the active layer. It should be noted that, for the sake of simplicity, FIG. 4A omits the first substrate, the second substrate, the display medium and the insulating layer. Referring to FIGS. 4A and 4B, the display 400 of the present embodiment is similar to the display 300 of FIG. 3A except that the active layers 146 of the transistors 140a of the present embodiment have a substantially H shape in the top view.

It should be noted that, even though the in-plane switching LCD (IPS-LCD) is described as an example in the present embodiment, the present invention is not limited thereto. The present invention may be applied in various displays, such as a twisted nematic LCD (TN-LCD) or a vertical alignment LCD (VA-LCD).

In view of the foregoing, the width of the portion of the active layer easily irradiated by environmental light is reduced to reduce the width of the black matrix used to shield the active layer, which effectively increases the pixel aperture ratio.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display, comprising:
   a first substrate;
   a plurality of gate lines and data lines disposed on the first substrate and cross each other; and
   a display medium disposed on the first substrate;
   a plurality of first transistors corresponding to the gate lines and the data lines respectively, wherein each of the first transistors comprises:
   a gate electrode; and
   a semiconductor layer overlapping with the gate electrode, wherein the semiconductor layer comprises an U-shaped portion in a top view,
   wherein the semiconductor layer has a first end portion, a second end portion and a necked-down portion disposed between the first end portion and the second end portion, and a first width of the necked-down portion along a direction perpendicular to an extension direction of one of the gate lines is less than a second width of the first end portion along the direction and a third width of the second end portion along the direction,
   wherein a projection projected from an entirety of the U-shaped portion of the semiconductor layer on the first substrate is located within a projection of the gate electrode on the first substrate.

2. The display as claimed in claim 1, further comprising a second substrate disposed on the first substrate, wherein the display medium disposed between the first substrate and the second substrate.

3. The display as claimed in claim 1, further comprising a black matrix disposed on the first substrate and corresponding to the gate lines and the data lines, wherein the black matrix has a shielding portion shielding the necked-down portion of each of the first transistors, and the shielding portion has a fourth width ranging from about 3 μm to about 36 μm in the direction perpendicular to the extension direction.

4. The display as claimed in claim 1, further comprising a black matrix disposed on the first substrate and corresponding to the gate lines and the data lines, wherein the black matrix has a shielding portion shielding the necked-down portion of each of the first transistors, and the shielding portion has a fourth width ranging from about 4 μm to about 20 μm in the direction perpendicular to the extension direction.

5. The display as claimed in claim 1, further comprising a black matrix disposed on the first substrate and corresponding to the gate lines and the data lines, wherein the black matrix has a shielding portion shielding the necked-down portion of each of the first transistors, and a shielding extension distances of the black matrix corresponding to the two opposite sides of the necked-down portion are equal to each other.

6. The display as claimed in claim 1, wherein the ratio of the first width to the second width ranges from about 0.2 to about 0.86.

7. The display as claimed in claim 1, wherein the channel width/length ratio of the first transistor ranges from about 0.3 to about 1.

\* \* \* \* \*